United States Patent [19]

Maciag

[11] 3,796,895

[45] Mar. 12, 1974

[54] PIEZOELECTRICALLY CONTROLLED SOLID STATE SWITCHING CIRCUIT

[75] Inventor: Edmund T. Maciag, Middleburg Heights, Ohio

[73] Assignee: Vernitron Corporation, Great Neck, Long Island, N.Y.

[22] Filed: Nov. 20, 1972

[21] Appl. No.: 307,971

[52] U.S. Cl. .................. 307/278, 307/308, 307/289, 219/504, 317/235 M

[51] Int. Cl. .............................................. H03k 3/00

[58] Field of Search ...... 317/235, 26; 307/308, 278, 307/289; 179/110 A; 219/501, 502, 503, 504

[56] References Cited

UNITED STATES PATENTS

| | | | |
|---|---|---|---|
| 3,128,412 | 4/1964 | Abromaitis | 307/278 |
| 3,285,074 | 11/1966 | Elazar | 307/308 X |
| 3,584,242 | 6/1971 | Fujita | 307/308 |
| 3,596,114 | 7/1971 | Maupin | 307/278 |

FOREIGN PATENTS OR APPLICATIONS

| | | | |
|---|---|---|---|
| 158,651 | 9/1954 | Australia | 179/110 A |

*Primary Examiner*—Andrew J. James

[57] ABSTRACT

A compact solid state switching circuit substantially independent of the rate of actuation, employing a piezoelectric bimorph element operative in conjunction with a bistable circuit to control the triggering of a thyristor.

7 Claims, 1 Drawing Figure

PATENTED MAR 12 1974
3,796,895
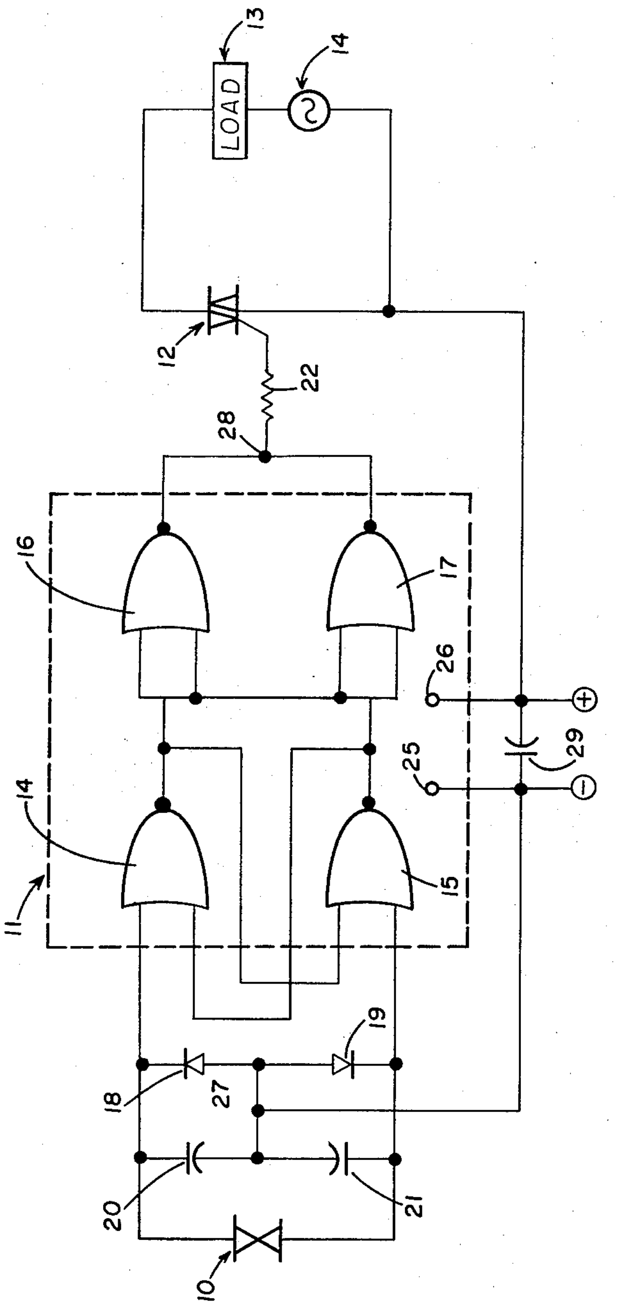

PIEZOELECTRICALLY CONTROLLED SOLID STATE SWITCHING CIRCUIT

BACKGROUND OF THE INVENTION

1. Field of the Invention

This invention relates to switching circuitry, and more particularly to solid state switching circuitry utilizing a piezoelectric element operating in a flexure mode to control non-mechanical circuit closures.

2. Description of the Prior Art

There is a continuing need for switching circuits which control the application of power to a load without using moving contacts. Solid state thyristors such as silicon controlled rectifiers and triacs have offered one way of fulfilling this need and quite a number of circuits are used for controlling such devices. In developing switching circuits of this type an important consideration lies in the amount of power required to effect the switching operation. Other important considerations are the reliability and the size of the unit employed.

It is known that piezoelectric elements will produce selected electrical outputs in response to certain mechanical stimulation. It is further known that these elements can be fabricated in assemblies of quite small size. On the other hand, the output of these elements is rather weak and it has been necessary to supply considerable amplification prior to use of the output for the control of power switching components.

Direct current power has been effectively controlled via silicon controlled rectifiers which are selectively gated into a conducting state by appropriately applied triggering impulses. These triggering impulses may be generated in a large number of ways and in one such direct current control circuit, a sensing circuit was developed for monitoring the impact of a mechanical press via the oscillation of a piezoelectric element. In this circuit, the output of the piezoelectric element was amplified and used to trigger a silicon controlled rectifier which was biased to switch only when normal operation of the press was exceeded. This rather limited utilization of a particular type of piezoelectric element, did effect control over power via a solid state switch; however, considerable circuitry and element cost was required.

When it is desired to control alternating current, the triac thyristor is of particular value. As disclosed in applicant's co-pending patent application Ser. No. 301,480, filed Oct. 27, 1972, there is disclosed a triac controlled circuit wherein a piezoelectric resonator in an oscillator circuit provides gating pulses to the triac. In this circuit, the piezoelectric resonator is selectively damped when it is desired to terminate oscillation and thereby open the triac switch.

SUMMARY OF THE INVENTION

The present invention takes advantage of the relatively recently developed metal oxide silicon field-effect transistors, known as MOSFETs. These transistors and the circuits employing them are generally developed on very compact integrated circuit chips and have input impedances on the order of from $10^{10}$ to $10^{12}$ ohms. This high input impedance makes it possible to drive the circuits with very little dissipation of energy and this characteristic in turn, is used to advantage in this invention to derive control signals from piezoelectric elements.

More specifically, the present invention uses a piezoelectric bimorph element which may be composed of two pieces of ceramic bonded to each side of a thin metal vane and polarized to yield a flexurally responsive element. The two pieces of ceramic are connected to form a series type Bimorph; that is, the inner electrodes of the two pieces of ceramic are connected together through the metal vane and external connection to the Bimorph is provided by the outer electrodes of the two pieces of ceramic. When such a piezoelectric Bimorph is deflected, a potential of one polarity will appear at one of the outer electrodes and a potential of the opposite polarity will appear at the other outer electrode. When the Bimorph is deflected in the opposite direction, the opposite polarities appear at the respective electrodes. Although the present circuitry suggests that utilization of a piezoelectric element operating in the bending mode is to be preferred, it is to be noted that the circuit is also feasible when utilizing piezoelectric elements of other configurations and constructions.

It is an object of the present invention to provide an improved solid state switching circuit.

It is another object of the present invention to provide an improved solid state switching circuit utilizing a bimorph piezoelectric element interconnected with MOSFET circuitry to develop a bistable output.

It is another object of the present invention to provide a solid state switching circuit including a bimorph piezoelectric element controlling a thyristor.

It is yet another object of the present invention to provide a solid state switching circuit wherein the switching is effected by deflection of a piezoelectric element.

It is still another object of the present invention to provide a solid state switching circuit wherein the switching is not dependent upon the rate at which a mechanical element is deflected.

Yet another object of the invention is to provide an improved solid state switching system of extremely small size and of great reliability.

In accordance with a particular embodiment of the invention there is disclosed a switching circuit comprising a piezoelectric bimorph element responsive to flexure to produce outputs of different polarity on two electrodes depending upon direction of flex. These outputs are used to supply bistable means which are responsive thereto in order to switch to a first or second state. Drive means are responsive to the switching of the bistable means and produce an output which can then be used to control a switch element such as the well known thyristors in the form of either a silicon controlled rectifier or a triac. It is a feature of the invention that the bistable means and the drive means lend themselves conveniently to logic NOR gate configurations and to incorporation into a single integrated circuit package.

The abovementioned objects of the invention, along with the various novel features thereof will be more fully understood and appreciated from the following detailed description which is made in conjunction with the drawing.

BRIEF DESCRIPTION OF THE DRAWINGS

The single FIGURE is a circuit schematic, using certain logic designations, of a piezoelectrically controlled solid state switching circuit embodying the present invention.

DESCRIPTION OF THE PREFERRED EMBODIMENT

The basic elements in the illustrated circuit diagram include: piezoelectric bimorph 10 on the extreme left side of circuit; a bistable integrated circuit package 11, controlled by piezoelectric element 10; and a triac 12 controlled by the output of circuit 11. Triac 12 is serially connected with an alternating current power supply 14 to a load 13. In accordance with normal operation the triac is selectively triggered to connect the power supply to the load.

Before describing a typical operating sequence for this circuit, attention is directed to the integrated circuit package 11. As shown, this circuit includes four logic NOR gates 14, 15, 16 and 17. Each gate has two inputs and a single output. The logic NOR function can be defined as follows: If one or both of the inputs have a logic one signal applied thereto, then the output will be logic zero. Stated another way, there will not be an output if either the first input or the second input has a signal applied thereto.

The integrated circuit chip 11 shown in this embodiment may take the specific form of commercially available unit RCA CD4001D, or its equivalent. This circuit package has input terminals 25 and 26 to which the necessary power is applied. A low voltage direct current power source polarized as shown may be utilized. In order to avoid spurious operation due to noise or other extraneous signals in the power circuit, a filter capacitor 29 may be connected across the power supply.

Integrated circuit 11 is arranged to perform two separate functions. Gates 14 and 15 are interconnected in order to produce a bistable circuit which will be switched in accordance with the polarity of input signals to assume a first or second state. Gates 16 and 17 are interconnected simply to provide a power amplification function and operate to amplify the output of the first two gates and apply it via a resistor 22 to the gate lead of triac 12.

The bistable connection of gates 14 and 15 is accomplished by interconnecting the output of each gate to one of the inputs of the other gate. The remaining inputs of each gate are then connected to the outer electrodes of piezoelectric element 10.

A pair of capacitors 20, 21 are serially connected across the outer electrodes of piezoelectric element 10. In addition, a pair of unidirectional current conducting devices, such as diodes 18 and 19, are connected serially with opposing polarity between the electrodes of piezoelectric element 10. In one particular embodiment of this invention, using the integrated circuit RCA CD4001D, diodes 18 and 19 were in fact part of the integrated circuit chip. The junction between capacitors 20 and 21 and the junction between diodes 18 and 19 are also interconnected at point 27, and this point in turn is connected to one terminal of the direct current source. The other terminal of the direct current source is connected to an anode of triac 12 and to one side of the alternating current power supply 14 that is to be connected to the load 13.

It will be recalled that the piezoelectric element is a bimorph which will produce a signal of particular polarity at either the upper or lower electrode, depending upon the direction in which it is flexed. Numerous mechanical means may be developed in order to control the flexing of this element. For convenience, a design wherein snap action flexing is accomplished, may be preferred.

Assume for example that element 10 is flexed to produce a positive potential on its upper electrode. This positive potential is effective to switch the bistable circuit composed of gates 14 and 15 to a first state and in addition charges capacitor 20 in the circuit through diode 19. Accordingly, the upper plate of capacitor 20 assumes a positive potential while the lower plate of capacitor 21 bears no charge relative to its upper plate inasmuch as it is shunted by diode 19. As long as the piezoelectric element 10 is maintained in its deflected position there will be no change in this charge polarity and conditions will remain generally static until the charge is dissipated through circuit losses. The high impedance characteristics of the MOSFET integrated circuit 11 assures slow dissipation of the charge on the input capacitors.

When element 10 is released to return to its starting position or flexed in the opposite direction, a charge of opposite polarity is produced and capacitor 21 is charged positively on its lower plate in the circuit through diode 18. At the same time, this positive output signal on the lower electrode of piezoelectric element 10 will cause the bistable circuit comprising elements 14 and 15 to assume its second state. The new charge on capacitor 21 will remain until gradually dissipated unless the piezoelectric element is again flexed or permitted to resume its original position.

If element 10 is released before dissipation of a previous charge, the charged capacitor will discharge and the other capacitor will charge through its associated diode charging circuit. Such a release causes reswitching of the bistable circuit.

The outputs of the bistable circuit are connected together in this embodiment of the invention and no distinction is made between them. NOR gates 16 and 17 are used simply as power amplifiers and in order to effect this function all of their inputs are connected together and all of their outputs are connected together. Consequently, each time the bistable circuit changes state it produces an input to the amplification stages created by gates 16 and 17 and these in turn produce an output which is applied via resistor 22 to the gate of triac 12.

One may use different amplification means than those shown in this particular embodiment of the invention; however, when one employs integrated circuitry it is convenient to minimize elements in the manner shown.

A review of the circuit operation described above illustrates that each time it is desired to switch the triac to a conducting state, it is merely necessary to flex or release piezoelectric bimorph 10. It will also be recognized that the degree of flex and the time duration over which it is accomplished is generally non-critical. One may slowly or rapidly flex the piezoelectric element. Although there are, of course, outside limits to the rate of flexure, it may be stated in general that the high impedance input of the bistable circuitry and the electrical storage function of the input capacitors makes it possible to store the charge as the flexing occurs until a triggering level is achieved. Thereafter, the state of the bistable means will remain constant until the piezoelectric element is released or flexed in the opposite direction.

A particular embodiment of the invention has been shown and described. Modifications will be apparent to those skilled in the art and all such modifications as come within the spirit and teachings of this disclosure are intended to be covered within the scope of the appended claims.

What is claimed is:

1. A switching circuit comprising a piezoelectric element responsive to flexure to produce outputs of different polarity on two electrodes depending upon the direction of flex, energy storage means charged by said outputs, MOSFET bistable means responsive to the charge of said energy storage means to switch to a first or second state respectively, and drive means operative in response to the switching of said bistable means to produce an output.

2. A switching circuit as defined in claim 1, including switching means connecting power to a load and operative to conduct in response to said output.

3. A switching circuit as defined in claim 2, wherein said switching means is a thyristor.

4. A switching circuit as defined in claim 1, wherein said MOSFET bistable means comprises a pair of logic NOR gates, one input of one gate being connected to one of said piezoelectric element electrodes and one input of the other gate being connected to the other of said piezoelectric element electrodes, a second input of each gate being connected to the output of the other gate.

5. A switching circuit as defined in claim 4, wherein said energy means comprises two serially connected energy storage means connected between said piezoelectric element electrodes; and including two serially connected, oppositely polarized, unidirectional current conducting means connected between said piezoelectric element electrodes; the junction between said energy storage means being connected to the junction between said unidirectional current conducting means.

6. A switching circuit as defined in claim 5, wherein said drive means comprises a pair of logic NOR gates having all inputs connected together and to the outputs of said bistable means, and having all outputs thereof connected together.

7. A switching circuit as defined in claim 6, including a thyristor serially connected between a power supply and a load, the conduction of said thyristor being controlled by the outputs of said drive means.

* * * * *